United States Patent
Shibuya

(10) Patent No.: US 11,667,825 B2
(45) Date of Patent: Jun. 6, 2023

(54) THERMALLY CONDUCTIVE SHEET AND METHOD FOR PRODUCING THE SAME

(71) Applicant: Fuji Polymer Industries Co., Ltd., Nagoya (JP)

(72) Inventor: Hitoshi Shibuya, Aichi (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 466 days.

(21) Appl. No.: 16/961,882

(22) PCT Filed: Oct. 2, 2019

(86) PCT No.: PCT/JP2019/038909
§ 371 (c)(1),
(2) Date: Jul. 13, 2020

(87) PCT Pub. No.: WO2020/179115
PCT Pub. Date: Sep. 10, 2020

(65) Prior Publication Data
US 2021/0214600 A1    Jul. 15, 2021

(30) Foreign Application Priority Data
Mar. 7, 2019 (JP) .............................. JP2019-041943

(51) Int. Cl.
| | |
|---|---|
| C09K 5/14 | (2006.01) |
| C08J 5/18 | (2006.01) |
| C08K 3/22 | (2006.01) |
| C08K 7/18 | (2006.01) |
| C08K 9/06 | (2006.01) |
| H01L 23/373 | (2006.01) |
| H01L 33/64 | (2010.01) |

(52) U.S. Cl.
CPC ................ *C09K 5/14* (2013.01); *C08J 5/18* (2013.01); *C08K 3/22* (2013.01); *C08K 7/18* (2013.01); *C08K 9/06* (2013.01); *C08J 2383/04* (2013.01); *C08K 2003/2227* (2013.01); *C08K 2201/001* (2013.01); *C08K 2201/005* (2013.01); *H01L 23/3737* (2013.01); *H01L 33/641* (2013.01)

(58) Field of Classification Search
CPC combination set(s) only.
See application file for complete search history.

(56) References Cited

U.S. PATENT DOCUMENTS

| | | |
|---|---|---|
| 2003/0170446 A1 | 9/2003 | Takahashi et al. |
| 2003/0229174 A1 | 12/2003 | Goto et al. |
| 2005/0004305 A1 | 1/2005 | Yamada et al. |
| 2006/0154087 A1 | 7/2006 | Asaine |
| 2011/0024675 A1 | 2/2011 | Endo et al. |
| 2015/0240075 A1 | 8/2015 | Imada et al. |
| 2017/0210964 A1 | 7/2017 | Ito et al. |
| 2020/0010621 A1 | 1/2020 | Suzumura |

FOREIGN PATENT DOCUMENTS

| | | |
|---|---|---|
| JP | 2001-217360 | 8/2001 |
| JP | 2002-261206 | 9/2002 |
| JP | 2003-145041 | 5/2003 |
| JP | 2003-253136 | 9/2003 |
| JP | 2005-042096 | 2/2005 |
| JP | 2013-147600 | 8/2013 |
| JP | 2015-201573 | 11/2015 |
| WO | 2014/034508 | 3/2014 |
| WO | 2019/098290 | 5/2019 |

OTHER PUBLICATIONS

NPL Viscosity Calculation p. 1 (Year: 2022).*
International Search Report issued in International Application No. PCT/JP2019/038909, dated Dec. 17, 2019, 3 pages.
Extended European Search Report issued in corresponding European Application No. 19906601.0, dated Mar. 11, 2021, 7 pages.
First Written Opinion issued in corresponding Singapore Patent Appliction No. 11202007192R, dated Nov. 15, 2022, 9 pages.

* cited by examiner

*Primary Examiner* — Robert T Butcher
(74) *Attorney, Agent, or Firm* — Hamre, Schumann, Mueller & Larson, P.C.

(57) ABSTRACT

A thermally conductive sheet contains a matrix resin and thermally conductive particles. The content of the thermally conductive particles is 200 parts by volume or more with respect to 100 parts by volume of the matrix resin component. A polymer viscosity of the matrix resin component after a crosslinking reaction in the absence of the thermally conductive particles is 500 Pa·s or less at 25° C. A thermal conductivity of the thermally conductive sheet is 2.0 W/m·K or more. When the thermally conductive sheet with an initial thickness of 1.5 mm is compressed at a compression rate of 5.0 mm/min to measure a 50% compressive load value, the maximum load value is 100 kPa or more and the load value after 1 minute is more than 0 kPa and 100 kPa or less. With this configuration, the thermally conductive sheet has a high thermal conductivity, a low steady load value, and flexibility.

10 Claims, 2 Drawing Sheets

THERMALLY CONDUCTIVE SHEET AND METHOD FOR PRODUCING THE SAME

TECHNICAL FIELD

The present invention relates to a thermally conductive sheet with a high thermal conductivity, a low steady load value, and flexibility, and a method for producing the thermally conductive sheet.

BACKGROUND ART

With the significant improvement in performance of semiconductors such as CPUs in recent years, the amount of heat generated by them becomes extremely large. For this reason, heat dissipating materials are attached to electronic components that may generate heat, and a thermally conductive sheet is used to improve the adhesion between heat dissipating members and semiconductors. The thermally conductive sheet has been required to have a high thermal conductivity, a low steady load value, and flexibility as recent devices become smaller in size and higher in performance. Patent Document 1 proposes to improve the compressibility, insulation properties, thermal conductivity, etc. of a heat conductive silicone composition by setting the viscosity of the composition to 800 Pa s or less at 23° C. before curing. Patent Document 2 proposes to improve the adhesion properties and followability of a heat conductive sheet to electronic components by using a heat conductive filler with a specific average particle size. Patent Document 3 proposes to improve the followability of a heat conductive sheet to electronic components by making the surface of the sheet uneven so that the sheet has high flexibility.

PRIOR ART DOCUMENTS

Patent Documents

Patent Document 1: JP 2013-147600 A
Patent Document 2: JP 2003-253136 A
Patent Document 3: JP 2001-217360 A

DISCLOSURE OF INVENTION

Problem to be Solved by the Invention

However, the conventional heat conductive sheets have problems in a steady load value and flexibility, and therefore need to be improved further.

To solve the above conventional problems, the present invention provides a thermally conductive sheet with a high thermal conductivity, a low steady load value, and flexibility and a method for producing the thermally conductive sheet.

Means for Solving Problem

A thermally conductive sheet of the present invention contains a matrix resin and thermally conductive particles. A content of the thermally conductive particles is 200 parts by volume or more with respect to 100 parts by volume of the matrix resin component. A polymer viscosity of the matrix resin component after a crosslinking reaction in the absence of the thermally conductive particles is 500 Pa·s or less at 25° C. A thermal conductivity of the thermally conductive sheet is 2.0 W/m·K or more. When the thermally conductive sheet with an initial thickness of 1.5 mm is compressed at a compression rate of 5.0 mm/min to measure a 50% compressive load value, a maximum load value is 100 kPa or more and a load value after 1 minute is more than 0 kPa and 100 kPa or less.

A method for producing the thermally conductive sheet of the present invention includes forming a compound with the following composition into a sheet, and heat-curing the sheet:

(A) 100 parts by volume of a base polymer component that is a linear organopolysiloxane having an average of two or more alkenyl groups per molecule, in which the alkenyl groups are bonded to silicon atoms at both ends of a molecular chain;

(B) a crosslinking component that is an organohydrogenpolysiloxane having an average of two or more hydrogen atoms bonded to silicon atoms per molecule, in which the number of moles of the organohydrogenpolysiloxane is less than 3 moles with respect to 1 mole of the alkenyl groups bonded to the silicon atoms in the component A;

(C) a catalyst component at a concentration of 0.01 to 1000 ppm based on a weight of metal atoms with respect to the component A; and (D) 200 parts by volume or more of thermally conductive particles with respect to 100 parts by volume of the component A.

Effects of the Invention

The thermally conductive sheet of the present invention contains 200 parts by volume or more of the thermally conductive particles with respect to 100 parts by volume of the matrix resin component. The polymer viscosity of the matrix resin component after the crosslinking reaction in the absence of the thermally conductive particles is 500 Pa·s or less at 25° C. The thermal conductivity of the thermally conductive sheet is 2.0 W/m·K or more. When the thermally conductive sheet with an initial thickness of 1.5 mm is compressed at a compression rate of 5.0 mm/min to measure a 50% compressive load value, the maximum load value is 100 kPa or more and the load value after 1 minute is more than 0 kPa and 100 kPa or less. Thus, the thermally conductive sheet can have a high thermal conductivity, a low steady load value, and flexibility. The particular feature that the polymer viscosity of the matrix resin component after the crosslinking reaction in the absence of the thermally conductive particles is 500 Pa·s or less at 25° C. increases the thermal conductivity, reduces the steady load value, and greatly relaxes the compression of the thermally conductive sheet. Since the thermally conductive sheet is gradually compressed, it can be held with a low load, and thus damage to the holding member is reduced. Because of its low load value and flexibility, the thermally conductive sheet follows the unevenness of electronic components well. Moreover, the thermally conductive sheet has good handleability due to the initial load value.

DESCRIPTION OF THE INVENTION

Figure 1:
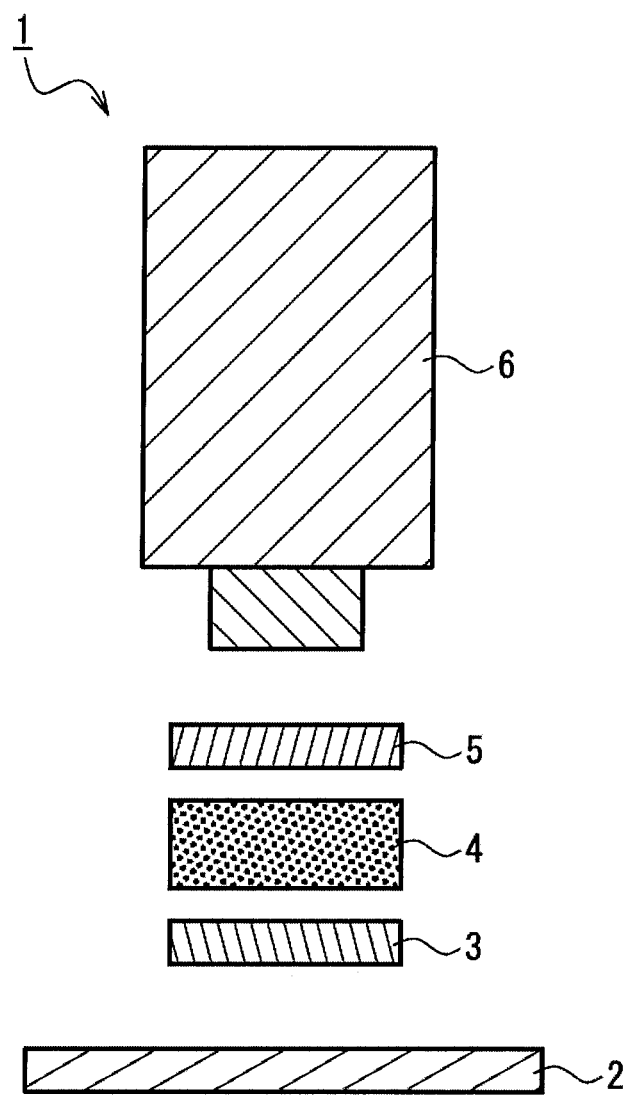
FIG. 1 is a schematically cross-sectional side view of a compressive load measuring device used in an example of the present invention.

The present invention is directed to a thermally conductive sheet that contains a matrix resin and thermally conductive particles. The matrix resin is a thermosetting resin. The polymer viscosity of the matrix resin component after the crosslinking reaction in the absence of the thermally conductive particles is 500 Pa·s or less at 25° C. This can improve the compression properties, so that the thermally conductive sheet has a low steady load value and is flexible. Specifically, when the thermally conductive sheet with an initial thickness of 1.5 mm is compressed at a compression rate of 5.0 mm/min to measure a 50% compressive load value, the maximum load value is 100 kPa or more and the load value after 1 minute is more than 0 kPa and 100 kPa or less. The maximum load value is preferably 250 kPa or more, and more preferably 400 kPa or more. The load value after 1 minute is preferably 0.5 to 50 kPa, and more preferably 0.5 to 30 kPa. Tb reduce the load value, an unreacted oil has conventionally been added, which may cause oil bleeding. However, the present invention eliminates the need for the unreacted oil and does not suffer from the problem of oil bleeding.

The content of the thermally conductive particles is 200 parts by volume or more with respect to 100 parts by volume of the matrix resin component. Thus, the thermal conductivity of the thermally conductive sheet is 2.0 W/m·K or more. The content of the thermally conductive particles is preferably 250 parts by volume or more, and more preferably 300 parts by volume or more with respect to 100 parts by volume of the matrix resin component. To maintain the sheet shape, the content of the thermally conductive particles is preferably 1000 parts by volume or less with respect to 100 parts by volume of the matrix resin component. The content of the thermally conductive particles is more preferably 900 parts by volume or less, and further preferably 800 parts by volume or less with respect to 100 parts by volume of the matrix resin component.

The matrix resin component is preferably a silicone polymer. The silicone polymer has good properties such as high heat resistance and flexibility and is suitable for a heat dissipating sheet. For example, an addition curing type silicone polymer, a peroxide curing type silicone polymer, and a condensation type silicone polymer may be used. Among them, the addition curing type silicone polymer using a catalyst component is preferred.

The polymer viscosity of the matrix resin component after the crosslinking reaction in the absence of the thermally conductive particles is preferably 1 to 300 Pa·s, and more preferably 1 to 150 Pa·s. Thus, the steady load value and flexibility of the thermally conductive sheet can be further improved.

The thermally conductive particles are preferably composed of at least one selected from the group consisting of metal oxide, metal hydroxide, aluminum nitride, boron nitride, and silica. The thermally conductive particles of these compounds have both high thermal conductivity and high electrical insulating properties. Moreover, it is preferable that the thermally conductive particles are surface treated with a silane compound, a titanate compound, an aluminate compound, or partial hydrolysates thereof. This can prevent the deactivation of a curing catalyst or a crosslinking agent and improve the storage stability.

It is preferable that the thermally conductive particles with an average particle size of 30 to 100 μm are 50 vol % or more and the thermally conductive particles with an average particle size of less than 30 μm are 50 vol % or less when the total amount of the thermally conductive particles is taken as a parameter. It is more preferable that the thermally conductive particles with an average particle size of 30 to 100 μm are 60 vol % or more and the thermally conductive particles with an average particle size of less than 30 μm are 40 vol % or less when the total amount of the thermally conductive particles is taken as a parameter. This can increase the thermal conductivity because the gaps between large particles are tightly filled with small particles.

The thermally conductive particles with an average particle size of 30 to 100 μm are preferably spherical in shape. The spherical thermally conductive particles can easily be mixed with organopolysiloxane of the matrix resin. The thermally conductive particles with an average particle size of less than 30 μm are preferably irregular in shape. This can increase the thermal conductivity because the gaps between the large spherical thermally conductive particles are tightly filled with the irregular thermally conductive particles.

It is preferable that the thermally conductive sheet is obtained by forming a compound with the following composition into a sheet, and cross-linking the sheet:

(A) 100 parts by volume of a base polymer component that is a linear organopolysiloxane having an average of two or more alkenyl groups per molecule, in which the alkenyl groups are bonded to silicon atoms at both ends of the molecular chain;

(B) a crosslinking component that is an organohydrogenpolysiloxane having an average of two or more hydrogen atoms bonded to silicon atoms per molecule, in which the number of moles of the organohydrogenpolysiloxane is less than 3 moles with respect to 1 mole of the alkenyl groups bonded to the silicon atoms in the component A;

(C) a catalyst component at a concentration of 0.01 to 1000 ppm based on the weight of metal atoms with respect to the component A; and (D) 200 parts by volume or more of thermally conductive particles with respect to 100 parts by volume of the component A (preferably 400 to 3000 parts by mass of the thermally conductive particles with respect to 100 parts by mass of the component A).

The heat curing conditions of the sheet are preferably that the temperature is 90 to 120° C. and the time is 5 to 180 minutes.

Hereinafter, each component will be described.

(1) Base Polymer Component (Component A)

The base polymer component is an organopolysiloxane having two or more alkenyl groups bonded to silicon atoms per molecule. The organopolysiloxane containing two or more alkenyl groups is the base resin (base polymer component) of a silicone rubber composition of the present invention. In the organopolysiloxane, two or more alkenyl groups having 2 to 8 carbon atoms, and preferably 2 to 6 carbon atoms such as vinyl groups or allyl groups are bonded to the silicon atoms per molecule. The viscosity of the organopolysiloxane is preferably 10 to 100,000 mPa·s, and more preferably 100 to 10,000 mPa·s at 25° C. in terms of workability and curability.

Specifically, an organopolysiloxane expressed by the following general formula (chemical formula 1) is used. The organopolysiloxane has an average of two or more alkenyl groups per molecule, in which the alkenyl groups are bonded to silicon atoms at both ends of the molecular chain. The organopolysiloxane is a linear organopolysiloxane whose side chains are blocked with alkyl groups. The viscosity of the linear organopolysiloxane is preferably 10 to 100,000 mPa·s at 25° C. in terms of workability and curability. Moreover, the linear organopolysiloxane may include a small amount of branched structure (trifunctional siloxane units) in the molecular chain.

[Chemical Formula 1]

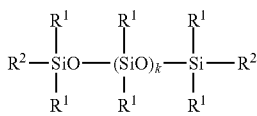

In the formula, $R^1$ represents substituted or unsubstituted monovalent hydrocarbon groups that are the same as or different from each other and have no aliphatic unsaturated bond, $R^2$ represents alkenyl groups, and k represents 0 or a positive integer. The monovalent hydrocarbon groups represented by $R^1$ preferably have 1 to 10 carbon atoms, and more preferably 1 to 6 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups. The alkenyl groups represented by $R^2$ preferably have 2 to 6 carbon atoms, and more preferably 2 to 3 carbon atoms. Specific examples of the alkenyl groups include vinyl, allyl, propenyl, isopropenyl, butenyl, isobutenyl, hexenyl, and cyclohexenyl groups. In particular, the vinyl group is preferred. In the general formula (1), k is typically 0 or a positive integer satisfying $0 \leq k \leq 10000$, preferably $5 \leq k \leq 2000$, and more preferably $10 \leq k \leq 1200$.

The component A may also include an organopolysiloxane having three or more, typically 3 to 30, and preferably about 3 to 20, alkenyl groups bonded to silicon atoms per molecule. The alkenyl groups have 2 to 8 carbon atoms, and preferably 2 to 6 carbon atoms and can be, e.g., vinyl groups or allyl groups. The molecular structure may be a linear, ring, branched, or three-dimensional network structure. The organopolysiloxane is preferably a linear organopolysiloxane in which the main chain is composed of repeating diorganosiloxane units, and both ends of the molecular chain are blocked with triorganosiloxy groups. The viscosity of the linear organopolysiloxane is preferably 10 to 100,000 mPa·s, and more preferably 100 to 10,000 mPa·s at 25° C.

Each of the alkenyl groups may be bonded to any part of the molecule. For example, the alkenyl group may be bonded to either a silicon atom that is at the end of the molecular chain or a silicon atom that is not at the end (but in the middle) of the molecular chain. In particular, a linear organopolysiloxane expressed by the following general formula (chemical formula 2) is preferred. The linear organopolysiloxane has 1 to 3 alkenyl groups on each of the silicon atoms at both ends of the molecular chain. In this case, however, if the total number of the alkenyl groups bonded to the silicon atoms at both ends of the molecular chain is less than 3, at least one alkenyl group is bonded to the silicon atom that is not at the end (but in the middle) of the molecular chain (e.g., as a substituent in the diorganosiloxane unit). As described above, the viscosity of the linear organopolysiloxane is preferably 10 to 100,000 mPa·s at 25° C. in terms of workability and curability. Moreover, the linear organopolysiloxane may include a small amount of branched structure (trifunctional siloxane units) in the molecular chain.

[Chemical Formula 2]

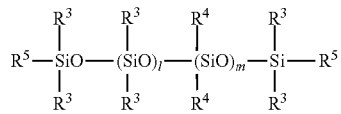

In the formula, $R^3$ represents substituted or unsubstituted monovalent hydrocarbon groups that are the same as or different from each other, and at least one of them is an alkenyl group, $R^4$ represents substituted or unsubstituted monovalent hydrocarbon groups that are the same as or different from each other and have no aliphatic unsaturated bond, $R^5$ represents alkenyl groups, and l and m represent 0 or a positive integer. The monovalent hydrocarbon groups represented by $R^3$ preferably have 1 to 10 carbon atoms, and more preferably 1 to 6 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; alkenyl groups such as vinyl, allyl, propenyl, isopropenyl, butenyl, hexenyl, cyclohexenyl, and octenyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups.

The monovalent hydrocarbon groups represented by $R^4$ also preferably have 1 to 10 carbon atoms, and more preferably 1 to 6 carbon atoms. The monovalent hydrocarbon groups may be the same as the specific examples of $R^1$, but do not include an alkenyl group. The alkenyl groups represented by $R^5$ preferably have 2 to 6 carbon atoms, and more preferably 2 to 3 carbon atoms. Specific examples of the alkenyl groups are the same as those of $R^2$ in the formula (chemical formula 1), and the vinyl group is preferred.

In the formula (chemical formula 2), l and m are typically 0 or positive integers satisfying $0 < l+m \leq 10000$, preferably $5 \leq l+m \leq 2000$, and more preferably $10 \leq l+m \leq 1200$. Moreover, l and m are integers satisfying $0 < l/(l+m) \leq 0.2$, and preferably $0.0011 \leq l/(l+m) \leq 0.1$.

(2) Crosslinking Component (Component B)

The organohydrogenpolysiloxane of the component B acts as a crosslinking agent. The addition reaction (hydrosilylation) between SiH groups in the component B and alkenyl groups in the component A produces a cured product. Any organohydrogenpolysiloxane that has two or more hydrogen atoms (i.e., SiH groups) bonded to silicon atoms per molecule may be used. The molecular structure of the organohydrogenpolysiloxane may be a linear, ring, branched, or three-dimensional network structure. The number of silicon atoms in a molecule (i.e., the degree of polymerization) may be 2 to 1000, and preferably about 2 to 300.

The locations of the silicon atoms to which the hydrogen atoms are bonded are not particularly limited. The silicon atoms may be either at the ends or not at the ends (but in the middle) of the molecular chain. The organic groups bonded to the silicon atoms other than the hydrogen atoms may be, e.g., substituted or unsubstituted monovalent hydrocarbon groups that have no aliphatic unsaturated bond, which are the same as those of $R^1$ in the general formula (chemical formula 1).

The organohydrogenpolysiloxane of the component B may have the following structure.

[Chemical Formula 3]

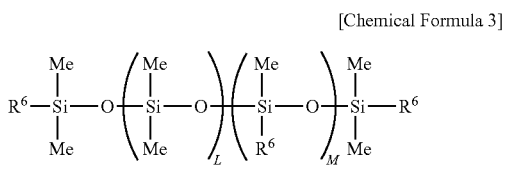

In the formula, $R^6$ may be the same as or different from each other and represents hydrogen, alkyl groups, phenyl groups, epoxy groups, acryloyl groups, methacryloyl groups, or alkoxy groups, and at least two of them are hydrogen. L represents an integer of 0 to 1000, and preferably 0 to 300, and M represents an j integer of 1 to 200.

(3) Catalyst Component (Component C)

The catalyst component of the component C accelerates the first stage curing of the composition. The component C may be a catalyst used for a hydrosilylation reaction. Examples of the catalyst include platinum group metal catalysts such as platinum-based, palladium-based, and rhodium-based catalysts. The platinum-based catalysts include, e.g., platinum black, platinum chloride, chloroplatinic acid, a reaction product of chloroplatinic acid and monohydric alcohol, a complex of chloroplatinic acid and olefin or vinylsiloxane, and platinum bisacetoacetate. The component C may be mixed in an amount necessary for curing. The amount of the component C can be appropriately adjusted in accordance with the desired curing rate or the like. The component C is preferably added at a concentration of 0.01 to 1000 ppm based on the weight of metal atoms with respect to the component A.

(4) Thermally Conductive Particles (Component D)

The thermally conductive particles of the component D are preferably added in an amount of 200 parts by volume or more with respect to 100 parts by volume of the component A (matrix component) (preferably 400 to 3000 parts by mass of the thermally conductive particles with respect to 100 parts by mass of the component A). The addition of the thermally conductive particles can maintain a high thermal conductivity. The thermally conductive particles are preferably composed of at least one selected from alumina, zinc oxide, magnesium oxide, aluminum nitride, boron nitride, aluminum hydroxide, and silica. The thermally conductive particles may have various shapes such as spherical, scaly, and polyhedral. When alumina is used, α-alumina with a purity of 99.5 mass % or more is preferred. The specific surface area of the thermally conductive particles is preferably 0.06 to 10 $m^2/g$. The specific surface area is a BET specific surface area and is measured in accordance with JIS R 1626. The average particle size of the thermally conductive particles is preferably 0.1 to 100 μm. The average particle size may be measured with a laser diffraction scattering method to determine D50 (median diameter) in a volume-based cumulative particle size distribution. The method may use, e.g., a laser diffraction/scattering particle size distribution analyzer LA-950 S2 manufactured by HORIBA, Ltd.

The thermally conductive particles may include at least two types of inorganic particles with different average particle sizes. This is because small-size inorganic particles fill the spaces between large-size inorganic particles, which can provide nearly the closest packing and improve the thermal conductivity.

It is preferable that the inorganic particles are surface treated with a silane compound or its partial hydrolysate. The silane compound is expressed by $R_aSi(OR')_{3-a}$, where R represents a substituted or unsubstituted organic group having 1 to 20 carbon atoms, R' represents an alkyl group having 1 to 4 carbon atoms, and a is 0 or 1. Examples of an alkoxysilane compound (simply referred to as "silane" in the following) expressed by $R_aSi(OR')_{3-a}$, where R represents a substituted or unsubstituted organic group having 1 to 20 carbon atoms, R' represents an alkyl group having 1 to 4 carbon atoms, and a is 0 or 1, include the following: methyltrimethoxysilane; ethyltrimethoxysilane; propyltrimethoxysilane; butyltrimethoxysilane; pentyltrimethoxysilane; hexyltrimethoxysilane; hexyltriethoxysilane; octyltrimethoxysilane; octyltriethoxysilane; decyltrimethoxysilane; decyltriethoxysilane; dodecyltrimethoxysilane; dodecyltriethoxysilane; hexadecyltrimethoxysilane; hexadecyltriethoxysilane; octadecyltrimethoxysilane; and octadecyltriethoxysilane. These silane compounds may be used individually or in combinations of two or more. The alkoxysilane and one-end silanol siloxane may be used together as the surface treatment agent. In this case, the surface treatment may include adsorption in addition to a covalent bond.

(5) Other Components

The composition of the present invention may include components other than the above as needed. For example, the composition may include an inorganic pigment such as colcothar, and alkyltrialkoxysilane used, e.g., for the surface treatment of a filler. Moreover, alkoxy group-containing silicone may be added, e.g., for the surface treatment of a filler.

EXAMPLES

Hereinafter, the present invention will be described byway of examples. However, the present invention is not limited to the following examples.

<Compressive Load>

The compressive load was measured in accordance with ASTM D575-91: 2012. FIG. 1 is a schematically cross-sectional side view of a compressive load measuring device used in an embodiment of the present invention. In FIG. 1, a compressive load measuring device 1 includes a sample stage 2 and a load cell 6. A thermally conductive sheet sample 4 was held between aluminum plates 3 and 5, mounted as shown in FIG. 1, and compressed by the load cell 6 until the sample reached a predetermined thickness. Then, the maximum load value when the sample was compressed to 50% of its thickness, and the load value after maintaining this compression for 1 minute, were recorded.

Measurement Conditions

Sample: circular in shape (with a diameter of 28.6 mm and a thickness of 1.5 mm)

Compressibility: 50%

Aluminum plate size: circular in shape (with a diameter of 28.6 mm) (compression surface)

Compression rate: 5 mm/min

Compression system: TRIGGER system (using the point at which a load of 2N is detected as the measurement start position)

Measuring device: MODEL-1310 NW (load cell 200 kgf) manufactured by Aikoh Engineering Co., Ltd.

<Thermal Conductivity>

Figure 2A:
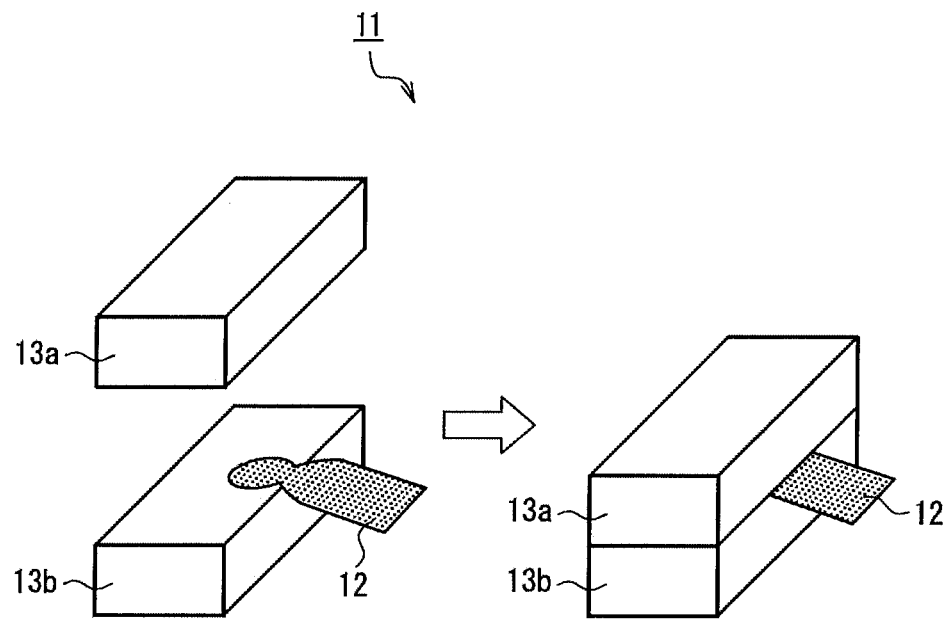
FIGS. 2A to 2B are diagrams illustrating a method for measuring a thermal conductivity used in an example of the present invention.
Figure 2B:
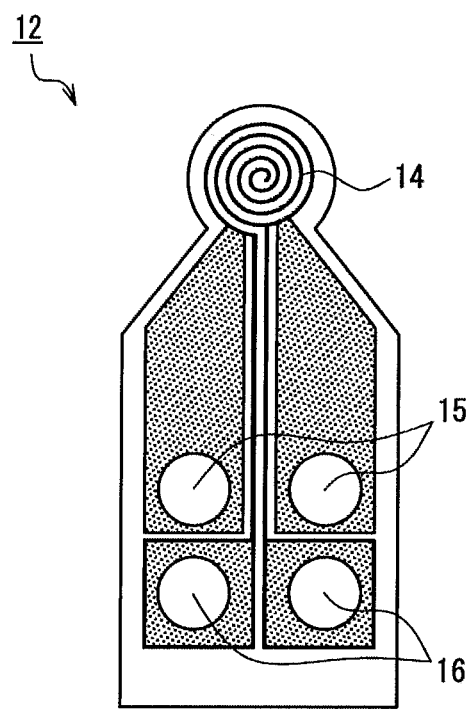

The thermal conductivity of a thermally conductive sheet was measured by a hot disk (in accordance with ISO/CD 22007-2). As shown in FIG. 2A, using a thermal conductivity measuring apparatus 11, a polyimide fim sensor 12 was sandwiched between two thermally conductive sheet samples 13a, 13b, and constant power was applied to the sensor 12 to generate a certain amount of heat. Then, the thermal characteristics were analyzed from a temperature rise value of the sensor 12. The sensor 12 has a tip 14 with a diameter of 7 mm. As shown in FIG. 2B, the tip 14 has a double spiral structure of electrodes. Moreover, an electrode 15 for an applied current and an electrode 16 for a resistance value (temperature measurement electrode) are located on the lower portion of the sensor 12. The thermal conductivity was calculated by the following formula (1).

$$\lambda = \frac{P_0 \cdot D(\tau)}{\pi^{3/2} \cdot r} \cdot \frac{D(\tau)}{\Delta T(\tau)} \qquad \text{[Formula 1]}$$

λ: Thermal conductivity (W/m·K)
$P_0$: Constant power (W)
r: Radius of sensor (m)
τ: $\sqrt{\alpha \cdot t / r^2}$
α: Thermal diffusivity of sample (m²/s)
t: Measuring time (s)
D(τ): Dimensionless function of τ
ΔT(τ): Temperature rise of sensor (K)

<Viscosity>

The viscosity was measured in accordance with JIS K 7117-1:1999.

Measuring device: Brookfield rotational viscometer, type C (in which the spindle number is changed with the viscosity)

Rotational speed: 10 RPM
Measurement temperature: 25° C.

Example 1

(1) Matrix Resin Component

A two-part room temperature curing silicone polymer was used as a matrix resin component. The two-part room temperature curing silicone polymer was composed of a solution A and a solution B. The solution A previously contained abase polymer component and a platinum metal catalyst. The solution B previously contained a base polymer component and a crosslinking component. When the solution A and the solution B were mixed and cured in the absence of the thermally conductive particles, the polymer viscosity after the crosslinking reaction was 30 Pa·s (25° C.). The uncured two-part room temperature curing silicone polymer was 100 parts by mass (i.e., 20.5 vol % based on 100 vol % of the total composition).

(2) Thermally Conductive Particles

As the thermally conductive particles, 1500 parts by mass of alumina was used (i.e., 79.5 vol % based on 100 vol % of the total composition).

The alumina included the following:

(i) 900 parts by mass of spherical particles with an average particle size of 75 µm (i.e., 48.5 vol % based on 100 vol % of the total composition);

(ii) 400 parts by mass of irregular particles with an average particle size of 2.2 µm (i.e., 20.5 vol % based on 100 vol % of the total composition); and (iii) 200 parts by mass of irregular particles with an average particle size of 0.6 µm (i.e., 10.5 vol % based on 100 vol % of the total composition).

(3) Thermally Conductive Sheet Forming

The uncured two-part room temperature curing silicone polymer and the thermally conductive particles were uniformly mixed. The mixture was sandwiched between polyester (PET) films, rolled to a thickness of 1.5 mm, and then cured at 100° C. for 120 minutes.

(4) Physical Properties of Thermally Conductive Sheet

The thermally conductive sheet thus obtained had a thermal conductivity of 5.5 W/mk, and a maximum load value of 450 kPa and a load value after 1 minute of 6 kPa (measured under the conditions of 50% compression and a compression rate of 5 mm/min). The thickness of the thermally conductive sheet was 1.5 mm.

Example 2

The experiments were performed in the same manner as Example 1 except that the silicone polymer was changed.

(1) Base polymer: the polymer viscosity after the crosslinking reaction was 100 Pa·s (250°).

(2) Thermally conductive particles

As the thermally conductive particles, 1500 parts by mass of alumina was used (i.e., 79.5 vol % based on 100 vol % of the total composition).

The alumina included the following:

(i) 900 parts by mass of spherical particles with an average particle size of 75 µm (i.e., 48.5 vol % based on 100 vol % of the total composition);

(ii) 400 parts by mass of irregular particles with an average particle size of 2.2 µm (i.e., 20.5 vol % based on 100 vol % of the total composition); and (iii) 200 parts by mass of irregular particles with an average particle size of 0.6 µm (i.e., 10.5 vol % based on 100 vol % of the total composition).

(3) Physical Properties of Thermally Conductive Sheet

The thermally conductive sheet thus obtained had a thermal conductivity of 5.2 W/mk, and a maximum load value of 500 kPa and a load value after 1 minute of 12 kPa (measured under the conditions of 50% compression and a compression rate of 5 mm/min). The thickness of the thermally conductive sheet was 1.5 mm.

Example 3

The experiments were performed in the same manner as Example 1 except that the silicone polymer and the filler were changed.

(1) Base polymer: the polymer viscosity after the crosslinking reaction was 100 Pa·s (250°).

(2) Thermally conductive particles

As the thermally conductive particles, 1500 parts by mass of alumina was used (i.e., 79.5 vol % based on 100 vol % of the total composition).

The alumina included the following:

(i) 900 parts by mass of spherical particles with an average particle size of 37 µm (i.e., 48.5 vol % based on 100 vol % of the total composition);

(ii) 400 parts by mass of irregular particles with an average particle size of 2.2 µm (i.e., 20.5 vol % based on 100 vol % of the total composition); and (iii) 200 parts by mass of irregular particles with an average particle size of 0.6 μm (i.e., 10.5 vol % based on 100 vol % of the total composition).

(3) Physical properties of thermally conductive sheet

The thermally conductive sheet thus obtained had a thermal conductivity of 4.5 W/mk, and a maximum load value of 900 kPa and a load value after 1 minute of 20 kPa (measured under the conditions of 50% compression and a compression rate of 5 mm/min). The thickness of the thermally conductive sheet was 1.5 mm.

Example 4

The experiments were performed in the same manner as Example 1 except that the silicone polymer and the filler were changed.

(1) Base polymer: the polymer viscosity after the crosslinking reaction was 60 Pa·s (25° C.).

(2) Thermally conductive particles

As the thermally conductive particles, 900 parts by mass of alumina was used (i.e., 69.3 vol % based on 100 vol % of the total composition).

The alumina included the following:

(i) 600 parts by mass of spherical particles with an average particle size of 75 μm (i.e., 46.2 vol % based on 100 vol % of the total composition); and (ii) 300 parts by mass of irregular particles with an average particle size of 2.2 μm (i.e., 23.1 vol % based on 100 vol % of the total composition).

(3) Physical properties of thermally conductive sheet

The thermally conductive sheet thus obtained had a thermal conductivity of 3.2 W/mk, and a maximum load value of 150 kPa and a load value after 1 minute of 2 kPa (measured under the conditions of 50% compression and a compression rate of 5 mm/min). The thickness of the thermally conductive sheet was 1.5 mm.

Comparative Example 1

The experiments were performed in the same manner as Example 1 except that the silicone polymer was changed.

(1) Base polymer: the polymer viscosity after the crosslinking reaction was 1200 Pa·s (25° C.).

(2) Thermally conductive particles

As the thermally conductive particles, 1500 parts by mass of alumina was used (i.e., 79.5 vol % based on 100 vol % of the total composition).

The alumina included the following:

(i) 900 parts by mass of spherical particles with an average particle size of 75 μm (i.e., 48.5 vol % based on 100 vol % of the total composition);

(ii) 400 parts by mass of irregular particles with an average particle size of 2.2 μm (i.e., 20.5 vol % based on 100 vol % of the total composition); and (iii) 200 parts by mass of irregular particles with an average particle size of 0.6 μm (i.e., 10.5 vol % based on 100 vol % of the total composition).

(3) Physical properties of thermally conductive sheet

The thermally conductive sheet thus obtained had a thermal conductivity of 5.2 W/mk, and a maximum load value of 1800 kPa and a load value after 1 minute of 170 kPa (measured under the conditions of 50% compression and a compression rate of 5 mm/min). The thickness of the thermally conductive sheet was 1.5 mm.

Comparative Example 2

The experiments were performed in the same manner as Example 1 except that the silicone polymer and the filler were changed.

(1) Base polymer: the polymer viscosity after the crosslinking reaction was 60 Pa·s (25° C.).

(2) Thermally conductive particles

As the thermally conductive particles, 450 parts by mass of alumina was used (i.e., 52.9 vol % based on 100 vol % of the total composition).

The alumina included the following:

(i) 300 parts by mass of spherical particles with an average particle size of 75 μm (i.e., 35.3 vol % based on 100 vol % of the total composition); and (ii) 150 parts by mass of irregular particles with an average particle size of 2.2 μm (i.e., 17.6 vol % based on 100 vol % of the total composition).

(3) Physical properties of thermally conductive sheet

The thermally conductive sheet thus obtained had a thermal conductivity of 1.5 W/mk, and a maximum load value of 30 kPa and a load value after 1 minute of 0 Pa (measured under the conditions of 50% compression and a compression rate of 5 mm/min). The thickness of the thermally conductive sheet was 1.5 mm.

Table 1 show the above conditions and the results.

TABLE 1

| | | Ex. 1 | Ex. 2 | Ex. 3 | Ex. 4 | Comp. Ex. 1 | Comp. Ex. 2 |
|---|---|---|---|---|---|---|---|
| Amount of matrix resin component added (vol %) | | 100 | 100 | 100 | 100 | 100 | 100 |
| Viscosity of only matrix resin component after crosslinking (Pa · s at 25° C.) | | 30 | 30 | 100 | 60 | 1200 | 60 |
| Thermally conductive particles | Spherical 30 to 100 μm (vol %) | 48.5 | 48.5 | 48.5 | 46.2 | 48.5 | 35.3 |
| | Irregular 1 to 10 μm (vol %) | 20.5 | 20.5 | 20.5 | 23.1 | 20.5 | 17.6 |
| | Irregular less than 1 μm (vol %) | 10.5 | 10.5 | 10.5 | 0 | 10.5 | 0 |
| | Total amount added (vol %) | 79.5 | 79.5 | 79.5 | 69.3 | 79.5 | 52.9 |
| Thermal conductivity of sheet (W/m · K) | | 5.5 | 5.2 | 4.5 | 3.2 | 5.2 | 1.5 |
| Maximum load value of sheet (kPa) | | 450 | 500 | 900 | 150 | 1800 | 30 |
| Load value after 1 minute of sheet (kPa) | | 6 | 12 | 20 | 2 | 170 | 0 |

As can be seen from Table 1, the results confirmed that, in Examples 1 to 4, the thermal conductivity was high, the steady load value was low, and the compression was greatly relaxed. Since the thermally conductive sheets of Examples 1 to 4 were gradually compressed, they could be held with a low load, and thus damage to the holding member was reduced. Because of their low load values and flexibility, the thermally conductive sheets had good followability to the unevenness of electronic components. Moreover, the thermally conductive sheets had good handleability due to the initial load values.

INDUSTRIAL APPLICABILITY

The thermally conductive sheet of the present invention is useful as a heat dissipating material that is interposed between the heat generating member and the heat dissipating member of, e.g., electronic components such as LEDs and household electrical appliances, information and communication modules including optical communication equipment, and components mounted on vehicles. The thermally conductive sheet of the present invention is also useful as a heat dissipating material for electronic components including semiconductors.

DESCRIPTION OF REFERENCE NUMERALS

1 Compressive load measuring device
2 Sample stage
3,5 Aluminum plate
4 Thermally conductive sheet sample
6 Load cell
11 Thermal conductivity measuring apparatus
12 Sensor
13a, 13b Thermally conductive sheet sample
14 Tip of the sensor
15 Electrode for applied current
16 Electrode for resistance value (temperature measurement electrode)

The invention claimed is:

1. A thermally conductive sheet comprising:
a matrix resin; and
thermally conductive particles,
wherein the thermally conductive particles consist of alumina particles,
a content of the alumina particles is 400 to 3000 parts by mass with respect to 100 parts by mass of the matrix resin component,
the alumina particles with an average particle size of 30 to 100 μm are 50 vol % or more and the alumina particles with an average particle size of less than 30 μm are 33 to 50 vol % with respect to 100 vol % of the total amount of the alumina particles,
the alumina particles with an average particle size of 30 to 100 μm are spherical in shape,
the alumina particles with an average particle size of less than 30 μm are irregular in shape,
the matrix resin in the thermally conductive sheet is cross-linked,
a polymer viscosity of the matrix resin component after a crosslinking reaction in the absence of the alumina particles is 500 Pa·s or less at 25° C.,
a thermal conductivity of the thermally conductive sheet is 2.0 W/m·K or more, and
when the thermally conductive sheet with an initial thickness of 1.5 mm is compressed at a compression rate of 5.0 mm/min to measure a 50% compressive load value, a maximum load value is 100 kPa or more and a load value after 1 minute is more than 0 kPa and 100 kPa or less.

2. The thermally conductive sheet according to claim 1, wherein the matrix resin component is a silicone polymer.

3. The thermally conductive sheet according to claim 1, wherein the matrix resin component is an addition curing type silicone polymer.

4. The thermally conductive sheet according to claim 1, wherein the polymer viscosity of the matrix resin component after the crosslinking reaction in the absence of the alumina particles is 1 to 150 Pa·s.

5. The thermally conductive sheet according to claim 1, wherein the alumina particles are surface treated with a silane compound, a titanate compound, an aluminate compound, or partial hydrolysates thereof.

6. A method for producing a thermally conductive sheet, comprising a matrix resin and thermally conductive particles, the method comprising:
forming a compound with the following composition into a sheet; and
heat-curing the sheet:
(A) 100 parts by volume of a base polymer component that is a linear organopolysiloxane having an average of two or more alkenyl groups per molecule, in which the alkenyl groups are bonded to silicon atoms at both ends of a molecular chain;
(B) a crosslinking component that is an organohydrogenpolysiloxane having an average of two or more hydrogen atoms bonded to silicon atoms per molecule, in which the number of moles of the organohydrogenpolysiloxane is less than 3 moles with respect to 1 mole of the alkenyl groups bonded to the silicon atoms in the component A;
(C) a catalyst component at a concentration of 0.01 to 1000 ppm based on a weight of metal atoms with respect to the component A; and
(D) 400 to 3000 parts by mass of thermally conductive particles with respect to 100 parts by mass of the component A,
wherein the thermally conductive particles consist of alumina particles,
the alumina particles with an average particle size of 30 to 100 μm are 50 vol % or more and the alumina particles with an average particle size of less than 30 μm are 33 to 50 vol % with respect to 100 vol % of the total amount of the alumina particles,
the alumina particles with an average particle size of 30 to 100 μm are spherical in shape,
the alumina particles with an average particle size of less than 30 μm are irregular in shape,
the matrix resin in the thermally conductive sheet is cross-linked,
a polymer viscosity of the matrix resin component after a crosslinking reaction in the absence of the alumina particles is 500 Pa·s or less at 25° C.,
a thermal conductivity of the thermally conductive sheet is 2.0 W/m·K or more, and
when the thermally conductive sheet with an initial thickness of 1.5 mm is compressed at a compression rate of 5.0 mm/min to measure a 50% compressive load value, a maximum load value is 100 kPa or more and a load value after 1 minute is more than 0 kPa and 100 kPa or less.

7. The method according to claim 6, wherein the heat curing conditions of the sheet are that a temperature is 90 to 120° C. and a time is 5 to 180 minutes.

8. The method according to claim 6, wherein the matrix resin component is an addition curing type silicone polymer.

9. The method according to claim 6, wherein the polymer viscosity of the matrix resin component after the crosslinking reaction in the absence of the alumina particles is 1 to 150 Pa·s.

10. The method according to claim 6, wherein the alumina particles are surface treated with a silane compound, a titanate compound, an aluminate compound, or partial hydrolysates thereof.

* * * * *